United States Patent [19]

Gobush et al.

[11] Patent Number: 5,264,039
[45] Date of Patent: Nov. 23, 1993

[54] VAPOR DEPOSITION APPARATUS

[75] Inventors: Raymond W. Gobush, Indianapolis, Ind.; Bryan J. Lovejoy, Clear Lake, Wis.

[73] Assignee: Union Carbide Chemicals & Plastics Technology Corporation, Danbury, Conn.

[21] Appl. No.: 840,320

[22] Filed: Feb. 24, 1992

[51] Int. Cl.$^5$ .............................................. C23C 16/00
[52] U.S. Cl. ................................... 118/724; 118/715; 118/728; 118/730; 427/255.6
[58] Field of Search ............... 118/715, 728, 724, 730; 427/255.6

[56] References Cited

U.S. PATENT DOCUMENTS

| | | |
|---|---|---|
| 3,246,627 | 4/1966 | Loeb et al. ............... 118/49 |
| 3,678,889 | 7/1972 | Murakami et al. ........... 118/720 |
| 4,401,053 | 8/1983 | Riley ........................... 118/721 |
| 4,495,889 | 1/1985 | Riley ........................... 118/666 |
| 4,552,092 | 11/1985 | Yanagi et al. ................ 118/730 |
| 4,556,471 | 12/1985 | Bergman ..................... 118/726 |
| 4,592,306 | 6/1986 | Gallego ....................... 118/719 |
| 4,683,143 | 7/1987 | Riley ........................... 427/8 |
| 4,699,082 | 10/1987 | Hakim ......................... 118/726 |
| 4,945,856 | 8/1990 | Stewart ....................... 118/715 |

*Primary Examiner*—Anthony McFarlane
*Attorney, Agent, or Firm*—W. K. Volles

[57] ABSTRACT

An apparatus is disclosed for coating an article with a coating material by vapor deposition wherein an improved deposition chamber having a base and a cover is employed. The cover of the deposition chamber is removable and interchangeable with other deposition chamber covers which have different sizes and geometries. By changing the covers, the inner surface area of the deposition chamber cover can be adjusted to accommodate the surface area of the articles to be coated. Thus, it is possible to avoid loses of parylene which can coat on the inner surface of the deposition chamber during the parylene coating process. A vapor deposition apparatus providing a generally upward flow pattern of parylene monomer is also disclosed.

17 Claims, 2 Drawing Sheets

VAPOR DEPOSITION APPARATUS

FIELD OF THE INVENTION

The present invention relates to an apparatus for coating articles by vapor deposition which comprises an improved deposition chamber having a base and a cover which is removable from the base and interchangeable with other covers having different sizes or geometries. The present invention also relates to a vapor deposition apparatus having an upward flow arrangement.

BACKGROUND OF THE INVENTION

Coating materials, e.g. polymers, are often used as protective barriers on circuit boards, electrical components, medical devices and the like. Parylene is a generic term often used to describe a class of poly-p-xylylenes (also sometimes referred to in the art as para-xylylenes) which are derived from a dimer of the structure:

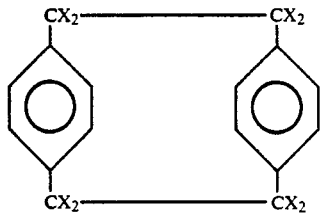

where X is typically hydrogen or a halogen. Due to its ability to provide thin films and conform to substrates of varied geometric shapes, parylene is ideally suited for use as a conformal coating.

Typically, parylene is applied by vapor deposition wherein the parylene monomer is condensed and polymerized directly on the article to be coated. Since the parylene monomer is not stable, the parylene dimer, as illustrated above, is used as the starting material.

The basic steps in applying parylene coatings by vapor deposition are disclosed, for example, in U.S. Pat. No. 4,945,856, issued Aug. 7th 1990. At col. 1, lines 32 to 66 it is disclosed that:

Accordingly, in most commercial applications, paraxylylene polymers are deposited on desired substrates by a pyrolytic deposition process known specifically as the "parylene process." Such process begins with the vaporization of a cyclic di-para-xylylene dimer. The dimer is pyrolytically cleaved at temperatures of about 400° to 750° C. to form a reactive para-xylylene monomer vapor. Thereafter, the reactive monomer vapor is transferred to a deposition chamber wherein the desired substrates are located. Within the deposition chamber, the reactive monomer vapor condenses upon the desired substrates to form a para-xylylene polymer or co-polymer film.

Any monomer vapor which fails to condense within the deposition chamber is subsequently removed by a cold trap which is maintained at approximately −70° C.

The entire parylene process is generally carried out in a closed system under constant negative pressure. Such closed system may incorporate separate chambers for the (a) vaporization, (b) pyrolysis, and (c) deposition steps of the process, with such chambers being connected by way of appropriate plumbing or tubular connections.

A typical problem in the parylene process is that parylene coats the inside of the deposition chamber and all of the objects within the deposition chamber as well as the articles which are desired to be coated. Thus, a substantial amount of parylene can be wasted.

The above referenced patent proposes a solution to the problem of wasting parylene. As stated at col. 2, lines 57 to 67, the patentee's invention provides:

... a condensation coating deposition chamber wherein uniformity of monomer vapor is maintained by inducting a rotary flow pattern within the chamber. Such rotary flow pattern obviates the need for baffles or other hardware elements thereby lessening the amount of polymer wasted during the process. Additionally, the parylene deposition chamber of the present invention provides greater versatility than the prior art devices because it is of modular design and, thus, easily detachable from the pyrolytic generating unit.

However, in practice, rotary flow patterns can be difficult to establish at the low pressures of the parylene process. As a result, coating thicknesses can vary drastically throughout the deposition chamber.

At col. 3, lines 3 to 12 the patentee discloses that the deposition chamber comprises:

a tank-like chamber body having a floor, a cylindrical wall, and an openable and closable lid. The monomer vapor enters tangentially near the top of the chamber through a tangentially connected monomer supply line. Such tangential entry of the monomer vapors results in a generally annular rotational flow of the vapors as they descend axially through the inner confines of the deposition chamber.

An improved solution to the problem of parylene waste is desired which does not require the elimination of baffles and the rather complicated flow arrangement described in the above-referenced patent to compensate for the lack of baffles. Further, in recognition that the surface area of the articles to be coated varies with the geometry and number of the articles, it would be desirable to provide a vapor deposition coating apparatus wherein the surface area of the deposition chamber could easily be modified to accommodate the surface area of the articles to be coated.

SUMMARY OF THE INVENTION

In accordance with the present invention an apparatus for coating an article (or articles) with a coating material by vapor deposition is provided which utilizes an improved deposition chamber. The deposition chamber comprises a base and a cover which is removable and interchangeable with other covers having different sizes or geometries. In addition, the apparatus of the present invention provides a generally upward flow pattern which can be used with or without the deposition chamber of the present invention.

By virtue of the present invention, it is now possible to reduce losses of coating material, which deposits on the inside of the deposition chamber, by adjusting the inner surface area of the deposition chamber to accommodate the surface area of the articles, i.e., by increasing the surface area ratio of the articles to the deposition chamber. The surface area of the deposition chamber can be conveniently adjusted by selecting a deposition chamber cover having the desired size and geometry.

In one aspect of the present invention there is provided an apparatus for coating an article with a coating material by vapor deposition under vacuum conditions. The apparatus comprises:

(a) a deposition chamber having:
  (i) a base having a top side, a bottom side, a first opening through said base and a second opening through said base; and
  (ii) a cover having an inner surface with a side wall, a top end, and a bottom end having an opening therein, wherein said cover is adapted to be removable from said base and positionable on the top side of said base such that the opening in the bottom end of said cover is in communication with the first opening and the second opening in said base;
(b) means for creating a vacuum in said deposition chamber by applying a suction to the first opening in said base; and
(c) means for introducing the coating material through the second opening in said base into said deposition chamber.

In another aspect of the present invention there is provided an apparatus for coating an article with parylene by vapor deposition under heated, vacuum conditions. The apparatus comprises:

(a) a deposition chamber having:
  (i) a base having a top side, a bottom side, a first opening through said base and a second opening through said base; and
  (ii) a cover having an inner surface with a side wall, a top end, and a bottom end having an opening therein, wherein said cover is adapted to be removable from said base and positionable on the top side of said base such that the opening in the bottom end of said cover is in communication with the first opening and the second opening in said base;
(b) a vacuum pump connected to the bottom side of said base and in communication with the first opening in said base;
(c) a heated pyrolysis zone connected to the bottom side of said base and in communication with the second opening in said base and positioned such that parylene monomer can pass upwardly through the pyrolysis zone in a generally vertical direction and be introduced into the deposition chamber to create a generally upward flow pattern; and
(d) a heated vaporization zone connected to said pyrolysis zone and positioned such that vaporized parylene dimer can be introduced into said pyrolysis zone.

In still yet another aspect of the present invention there is provided an improved apparatus for coating an article with a coating material by vapor deposition under vacuum conditions comprising:

(a) a deposition chamber;
(b) means for creating a vacuum in said deposition chamber; and
(c) means for introducing the coating material into said deposition chamber: the improvement which comprises means for introducing parylene monomer into the deposition chamber to create a generally upward flow pattern of the parylene monomer in the deposition chamber.

DETAIL DESCRIPTION OF THE INVENTION

The invention is hereafter described with reference to the drawings which are presented for illustrative purposes and are not intended to limit the scope of the claims which follow. Any reference to the term "article" is intended to include the plural form "articles".

Figure 1:
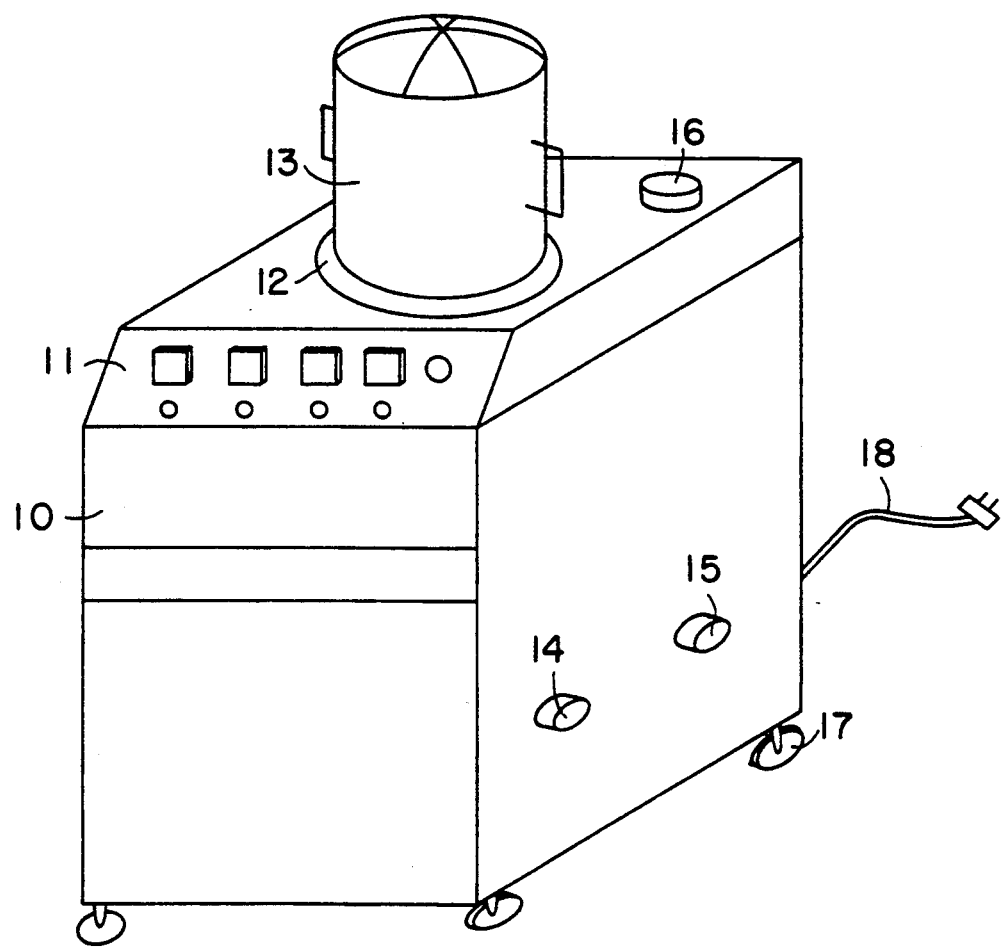
FIG. 1 is a perspective view of a vapor deposition apparatus, in accordance with the present invention.

FIG. 1 illustrates an aspect of the present invention wherein a portable vapor deposition apparatus is provided. The apparatus comprises a cabinet 10 which houses a vaporization chamber, a pyrolysis chamber, a vacuum pump, a cryogenic condensation trap, tubing controls, and the like (not shown); a control panel 11; a deposition chamber comprising a base 12 and a removable cover 13 (further described with reference to FIG. 2).

A feed line 14 is provided in order to introduce the coating material into the vaporization chamber. An effluent line 15 is provided to carry effluent from the vacuum pump away from the apparatus. A line 16 is provided to introduce cryogenic liquid to the cryogenic condensation trap. Castors 17 are provided for easy mobility of the apparatus.

The electric power supply must be capable of providing sufficient power for the heaters used in vaporization chamber and the pyrolysis chamber in addition to the vacuum pump and the other electrical components. The apparatus illustrated in FIG. 1 is configured to operate on a power supply of 15 amps with 115 volts AC. A power cord 18 is provided.

Figure 2:
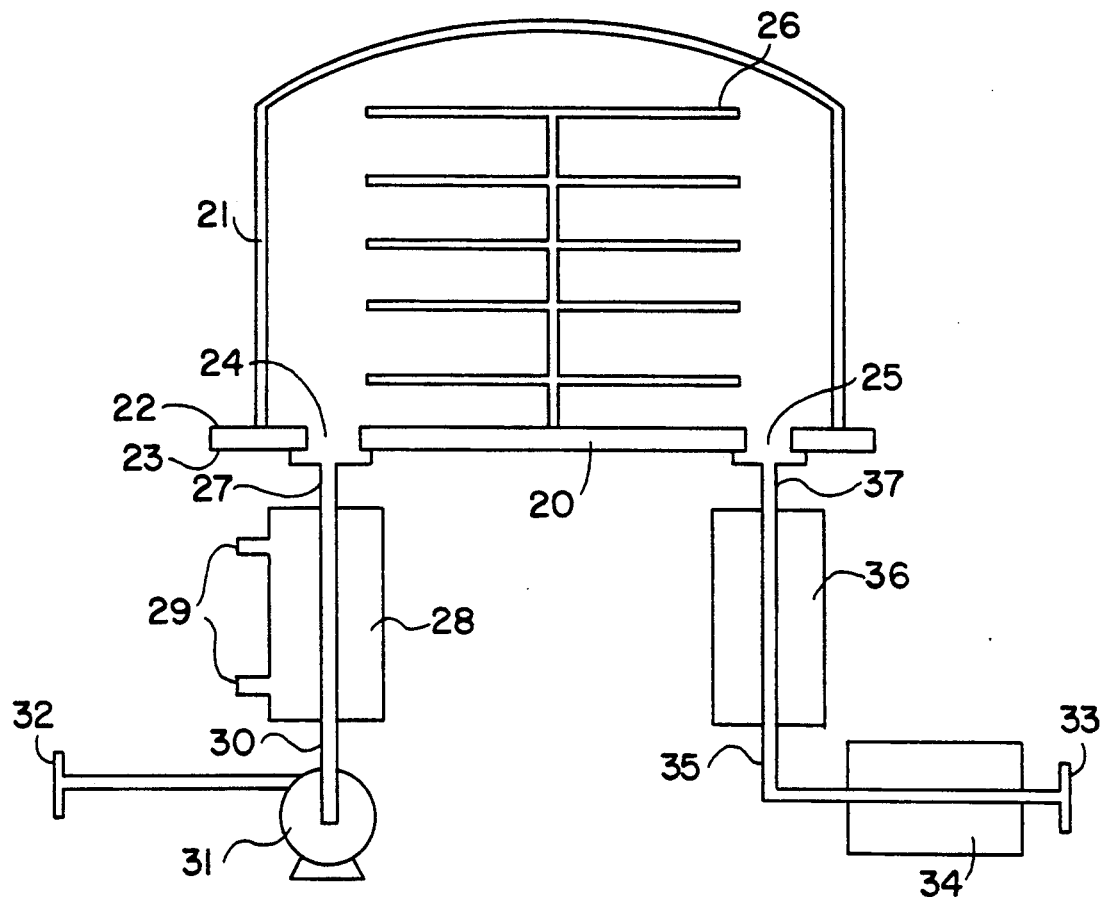
FIG. 2 is a schematic diagram of a vapor deposition apparatus in accordance with the present invention.

FIG. 2 illustrates a schematic of the apparatus of the present invention which is applicable to a portable vapor deposition apparatus, such as illustrated in FIG. 1, as well as larger scale units such as described in above-referenced U.S. Pat. No. 4,945,356.

FIG. 2 is hereafter described with reference to parylene as the coating material, although those skilled in the art will recognize that other polymers may exist, now or in the future, which are suitable for use as coating materials in the apparatus of the present invention. Parylene dimer, the starting material, is commercially available from a variety of sources, e.g., Union Carbide Chemical and Plastics Company Inc., Danbury, Conn.

The deposition chamber comprises a base 20 and a cover 21. The base has a top side 22, a bottom side 23, a first opening 24 and a second opening 25 which extend through the base. The cover has an inner surface with a side wall, a top end, and a bottom end which is at least partially open. Preferably, the opening in the bottom end of the cover is sufficiently large to permit the cover to be removed from the base without disturbing the article(s) to be coated. Even more preferably, substantially the entire bottom end of the cover is open. As noted above, the cover 21 is removable from the base 20. The term "removable" as used herein means that the cover can be separated, or detached, from the base.

The cover of the deposition chamber can have a variety of sizes and geometries in order to achieve the desire surface area. For example, the covers can have a cylindrical, conical, domal, square or rectangular shape. Preferably, the ratio of the total surface area of the article(s) to be coated to the inner surface area of the cover is greater than 1:1, more preferably greater than 5:1, and most preferably greater than 10:1.

Typically, a support fixture 26 will be used in the deposition chamber in order to support the articles to be coated. The geometry of the support fixture is dependent upon various factors such as the size and number of the article(s) to be coated and is not narrowly critical to the present invention. However, the support fixture will typically comprise plate-like panels having the same general shape as the cover of the deposition chamber, e.g. circular, connected by one or more vertical support members.

Once the article is positioned on the top side 22 of base 20, or the support fixture if one is used, the deposition chamber cover can be positioned on the base such that the opening in the bottom end of the cover is in communication with the two openings through the base. Preferably, the opening in the cover is in direct communication with the first opening and the second opening in the base. The cover can be secured to the base by any known means, e.g. clamping. In a preferred aspect of the invention, a vapor tight seal is accomplished by positioning an appropriately sized "O" ring in between the deposition chamber cover and the base.

A suction line 27 is connected to the bottom side 23 of base 20 and in communication with opening 24. Suction line 27 passes through a cryogenic condensation trap 28 wherein residual vapors of parylene monomer are condensed, polymerized and isolated. A suitable cryogenic liquid, e.g. liquid nitrogen, can be introduced and/or removed through line 29 (two are shown).

In addition to the cryogenic condensation trap, high surface area materials can be used to promote the condensation of the parylene monomer. One preferred high surface area recovery means comprises a bundle of tubular members aligned axially within a tube in order to provide a high surface area upon which the vapors of parylene monomer can condense. More preferably, the tubular members are disposable. The tube containing the bundle of tubular members is interposed in the flow path of the parylene vapors, preferably in between the deposition chamber and the vacuum pump. Depending upon the surface area required, it may be desirable to extend the tube upwardly into the deposition chamber. The above-described recovery means comprising the bundle of high surface area tubular members can be used alone or in combination with the cryogenic condensation trap.

Residual vapor from condensation trap 28 is withdrawn by a line 30 and passed through a vacuum pump 31. The vacuum pump operates in order to provide subatmospheric pressure in the deposition chamber and preferably to provide a pressure of about 10 to 50 millitorrs in the deposition chamber. The discharge from the vacuum pump is withdrawn from the apparatus by a line 32.

Parylene dimer is introduced to the apparatus by a line 33 which is connected to a vaporization chamber 34 wherein the parylene dimer is vaporized. The vaporization chamber comprises a heater which is capable of vaporizing the parylene at typical pressures used in the parylene process. The temperature in the vaporization chamber typically ranges from about 80° to about 200° C.

Vaporized parylene dimer is withdrawn from the vaporization chamber by a line 35 and passed to a pyrolysis chamber 36 wherein the parylene dimer is pyrolyzed to form the parylene monomer. The pyrolysis chamber comprises a heater which is capable of pyrolyzing the parylene dimer at typical pressures used in the parylene process. The temperature in the pyrolysis chamber typically ranges from about 500° to 750° C. A preferred heater for use in the pyrolysis chamber is one wherein the heating elements are molded in a ceramic fiber composite to conform to the outer dimensions of the pyrolysis chamber. Such heaters are commercially available, e.g. Watlow Electric Co., St. Louis, Mo.

Parylene monomer is withdrawn from the pyrolysis chamber by a line 37 which is connected to the bottom side 23 of the base 20 and in communication with opening 25. Preferably, the pyrolysis chamber is positioned in a generally vertical direction under the base in order to permit the parylene monomer to flow into the deposition chamber in a generally upward direction.

Often the apparatus of the present invention will include a baffle positioned within deposition chamber in order to further direct parylene monomer into desired areas within the deposition chamber, e.g. upwardly and laterally. In addition to providing good flow distribution, the use of a baffle is preferred because impurities in the parylene dimer have a tendency to plate-out on the baffle instead of on the articles to be coated.

The apparatus of the present invention also includes means for controlling the parylene process. Preferably the control means comprises a pressure sensor in the deposition chamber which provides an input to a controller. The controller then compares the input with a set point value and adjusts the vaporization rate of the parylene dimer in the vaporization chamber. Even more preferably, a proportional-integral-derivative ("PID") control loop is employed. It has been found that a PID control loop can readily accommodate changes in the geometry, number and surface area of the articles to be coated, as well as the inner surface area of the deposition chamber cover. As a result, with PID control it is possible to minimize the time required to perform the parylene process. PID controllers are commercially available.

In addition to the process control means, the apparatus of the present invention preferably comprises additional safety and end-of-run controls which can indicate the status of the variables in the process, e.g. temperature, pressure and quantity of parylene remaining.

Another aspect of the present invention relates to the discovery that the use of a generally upward flow pattern can provide surprisingly even coating thicknesses on the article(s) to be coated throughout the deposition chamber. Without being limited to any particular theory, it is believed that with tangential/downward flow patterns, the parylene monomer vapors can loose energy when they collide with the side walls of the deposition chamber and, as a result, condense and polymerize before being thoroughly dispersed in the deposition chamber. In contrast, with an upward flow pattern, the parylene monomer vapors have a natural tendency to rise and it is believed there is a lesser degree of collision with the side walls. As a result, it is believed that the vapors can disperse more thoroughly throughout the disposition chamber before condensing and polymerizing.

Accordingly, the apparatus of the present invention comprises means for introducing the coating material, e.g., parylene monomer, to create a generally upward flow pattern of the coating material in the deposition chamber. A preferred means of introducing the coating material into the deposition chamber comprises positioning the pyrolysis chamber of the apparatus below the deposition chamber such as described with reference to FIG. 2. However, those skilled in the art will recognize that various other means exist, such as, for example, introducing the coating material laterally into a lower portion of the deposition chamber and thereafter directing the flow of the coating material upwardly, e.g., by baffles, into the deposition chamber. Thus, in accordance with the present invention, an upward flow pattern can be used with or without the improved deposition chamber described hereinabove.

Although the invention has been described herein with the respect to specific aspects, those skilled in the art will recognize that modifications and alterations may be made without departing from the spirit and scope of the invention.

We claim:

1. An apparatus for coating an article with a coating material by vapor deposition under vacuum conditions, comprising:
   (a) a deposition chamber comprising:
      (i) a base having a top side, a bottom side, a first opening through said base and a second opening through said base; and
      (ii) a cover having an inner surface with a side wall, a top end, and a bottom end having an opening therein, wherein said cover is adapted to be removable from said base and positionable on the top side of said base such that the opening in the bottom end of said cover is in communication with the first opening and the second opening in said base;
   (b) means for creating a vacuum in said deposition chamber by applying a suction to the first opening in said base; and
   (c) means for introducing the coating material through the second opening in said base into said deposition chamber to create a generally upward flow pattern of the coating material in the deposition chamber.

2. An apparatus according to claim 1 wherein said cover has a cylindrical shape.

3. An apparatus according to claim 1 wherein said cover has a conical shape.

4. An apparatus according to claim 1 wherein said cover has a domal shape.

5. An apparatus according to claim 1 wherein said cover has a square or rectangular shape.

6. An apparatus according to claim 1 wherein the ratio of the surface area of the article to the inner surface area of the cover is greater than 1:1.

7. An apparatus according to claim 1 wherein the ratio of the surface area of the article to the inside surface area of the cover is greater than 5:1.

8. An apparatus according to claim 1 wherein the ratio of the surface area of the article to the inside surface area of the cover is greater than 10:1.

9. An apparatus according to claim 1 wherein the coating material is parylene.

10. An apparatus according to claim 1 wherein the opening in said cover is in direct communication with the first opening and the second opening in said base.

11. An apparatus for coating an article with parylene by vapor deposition under heated, vacuum conditions, comprising:
    (a) a deposition chamber comprising:
       (i) a base having a top side, a bottom side, a first opening through said base and a second opening through said base; and
       (ii) a cover having an inner surface with a side wall, a top end, and a bottom end having an opening therein, wherein said cover is adapted to be removable from said base and positionable on the top side of said base such that the opening in the bottom end of said cover is in communication with the first opening and the second opening in said base;
    (b) a vacuum pump connected to the bottom side of said base and in communication with the first opening in said base;
    (c) a heated pyrolysis chamber connected to the bottom side of said base and in communication with the second opening in said base and positioned such that parylene monomer can pass upward through the pyrolysis chamber in a generally vertical direction and be introduced into the deposition chamber to create a generally upward flow pattern; and
    (d) a heated vaporization chamber connected to said pyrolysis chamber and positioned such that vaporized parylene dimer can be introduced into said pyrolysis chamber.

12. An apparatus according to claim 11 which further comprises a support fixture positioned within said deposition chamber for holding said article.

13. An apparatus according to claim 11 which further comprises a baffle positioned within said deposition chamber to direct the parylene monomer into the deposition chamber.

14. An apparatus according to claim 11 which further comprises parylene recovery means interposed between said vacuum pump and said base.

15. An apparatus according to claim 14 wherein said recovery means comprises a cryogenic condensation trap.

16. An apparatus according to claim 14 wherein said recovery means comprises a bundle of tubular members aligned axially within a tube having a first end and a second end, said first end being connected to the bottom of said base and in communication with the first opening in said base, and said second end being connected to said vacuum pump.

17. An apparatus according to claim 14 wherein said recovery means comprises a bundle of tubular members aligned axially within a tube having a first end and a second end, said first end being connected to the top side of said base and in communication with the first opening in said base, and said second end extending into said deposition chamber.

* * * * *